United States Patent
Saggio et al.

(10) Patent No.: US 8,344,449 B2
(45) Date of Patent: Jan. 1, 2013

(54) MANUFACTURING PROCESS OF A POWER ELECTRONIC DEVICE INTEGRATED IN A SEMICONDUCTOR SUBSTRATE WITH WIDE BAND GAP AND ELECTRONIC DEVICE THUS OBTAINED

(75) Inventors: Mario Giuseppe Saggio, Aci Castello (IT); Edoardo Zanetti, Valverde (IT); Ferruccio Frisina, Sant'Agata Li Battiati (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 317 days.

(21) Appl. No.: 12/641,146

(22) Filed: Dec. 17, 2009

(65) Prior Publication Data
US 2010/0163888 A1    Jul. 1, 2010

(30) Foreign Application Priority Data
Dec. 30, 2008    (IT) .............................. TO2008A1017

(51) Int. Cl.
*H01L 29/66*    (2006.01)
(52) U.S. Cl. ... 257/328; 257/341; 257/76; 257/E29.262; 257/E21.41; 438/268; 438/273
(58) Field of Classification Search .................. 257/328, 257/335, 341, 76, E29.262, E21.41; 438/268, 438/273
See application file for complete search history.

(56) References Cited

U.S. PATENT DOCUMENTS

| | | | |
|---|---|---|---|
| 5,510,281 A | 4/1996 | Ghezzo et al. | |
| 6,051,862 A | 4/2000 | Grimaldi et al. | |
| 6,054,352 A | 4/2000 | Ueno | |
| 2004/0065921 A1* | 4/2004 | Iwamoto et al. | 257/341 |
| 2008/0038890 A1* | 2/2008 | Tucker | 438/270 |

FOREIGN PATENT DOCUMENTS

| | | |
|---|---|---|
| EP | 1111685 | 6/2001 |
| EP | 1742271 | 10/2007 |
| EP | 1970945 | 9/2008 |

OTHER PUBLICATIONS

Italian Search Report for TO2008A001017, Report completed: Aug. 20, 2009.

* cited by examiner

*Primary Examiner* — Tu-Tu Ho
(74) *Attorney, Agent, or Firm* — Graybeal Jackson LLP

(57) ABSTRACT

An embodiment of a process for manufacturing an electronic device on a semiconductor body of a material with wide forbidden bandgap having a first conductivity type. The process comprises the steps of: forming, on the semiconductor body, a first mask having a first window and a second window above a first surface portion and a second surface portion of the semiconductor body; forming, within the first and second surface portions of the semiconductor body underneath the first and second windows, at least one first conductive region and one second conductive region having a second conductivity type, the first conductive region and the second conductive region facing one another; forming a second mask on the semiconductor body, the second mask having a plurality of windows above surface portions of the first conductive region and the second conductive region; forming, within the first conductive region and the second conductive region and underneath the plurality of windows, a plurality of third conductive regions having the first conductivity type; removing completely the first and second masks; performing an activation thermal process of the first, second, and third conductive regions at a high temperature; and forming body and source regions.

26 Claims, 16 Drawing Sheets

US 8,344,449 B2

MANUFACTURING PROCESS OF A POWER ELECTRONIC DEVICE INTEGRATED IN A SEMICONDUCTOR SUBSTRATE WITH WIDE BAND GAP AND ELECTRONIC DEVICE THUS OBTAINED

PRIORITY CLAIM

The present application claims priority to Italian Patent Application No. TO2008A001017, filed Dec. 30, 2008, which application is incorporated herein by reference in its entirety.

TECHNICAL FIELD

An embodiment of the present disclosure relates to a process for manufacturing an electronic power device integrated in a wide-bandgap semiconductor substrate and to the electronic device thus obtained, in particular a MOSFET device integrated in a silicon carbide (SiC) substrate.

BACKGROUND

As is known, semiconductor materials having a wide forbidden bandgap, in particular having an energy value Eg of the forbidden band greater than 1.1 eV, low resistance in the ON state ($R_{ON}$), high value of thermal conductivity, high operating frequency, and high saturation value of speed of the conduction charges, are ideal for the manufacturing of electronic components, such as, for example, transistors or switches, in particular for power applications. A material having these characteristics and suitable for use in the manufacture of electronic components is silicon carbide (SiC). In particular, silicon carbide, in its different polytypes (for example, 3C—SiC, 4H—SiC, 6H—SiC), may be preferable to silicon as regards the properties listed above.

Electronic devices provided on a silicon carbide substrate, as compared to similar devices provided on a silicon substrate, may possess a plurality of advantageous characteristics, such as, for example, a low output resistance in the ON state, a low leakage current, high operating temperatures, and high operating frequencies.

Likewise well known is the fact that, in order to form integrated electronic devices in a silicon carbide substrate, it is necessary to introduce into the substrate dopant elements for generating doped regions of an N type or of a P type. For example, by implanting nitrogen (N) atoms or phosphorus (P) atoms, donors are introduced, which provide regions of an N type, whilst by implanting boron (B) atoms or aluminium (Al) atoms, acceptors are introduced, which provide regions of a P type.

A technological problem, associated with activation of the donors and of the acceptors implanted, regards the fact that any type of dopant element implanted in the silicon carbide requires a particularly high activation temperature, equal to or higher than 1800° C. A temperature that is so high can, however, damage other components or fabrication layers present on the substrate during the process of thermal activation, for example, the layers used for definition of the implanted areas, as well as the SiC substrate itself.

A possible solution to this problem is described in the patent application No. EP 1 742 271, which is incorporated by reference, and in which doped surface regions are provided by implanting in a localized way dopant elements in a 4H—SiC substrate, by means of appropriate ion implantations performed according to various angles and without using processes of thermal diffusion.

Said solution, however, may not be optimal, in so far as it requires particular arrangements for performing the process of ion implantation, such as, for example, precise angles of implantation. Finally, it may be necessary to perform, after the implantation process, a thermal-annealing step for enabling activation of the implanted elements. The optimal annealing temperature, higher than 1600° C., cannot, however, be reached on account of the presence of various layers deriving from the production process. At said temperature, in fact, the layers present on the substrate would be damaged in an irreversible way.

SUMMARY

An embodiment of the present disclosure is a process for manufacturing an electronic power device integrated in a wide-bandgap semiconductor substrate and the electronic device thus obtained that will be free from one or more drawbacks of the known art.

BRIEF DESCRIPTION OF THE DRAWINGS

For a better understanding of the present disclosure, one or more embodiments are now described, purely by way of non-limiting example, with reference to the attached drawings, wherein.

DETAILED DESCRIPTION

An embodiment of the manufacturing process described in what follows regards, in particular, a power MOSFET device with vertical structure. However, it is clear that said process, with the appropriate variations, may be used for providing any electronic power device, in particular whenever there is the need to integrate an electronic device in a semiconductor substrate with wide forbidden bandgap and high temperature of diffusion and/or activation of the implanted dopant elements, such as, for example, silicon carbide (SiC).

Figure 1:
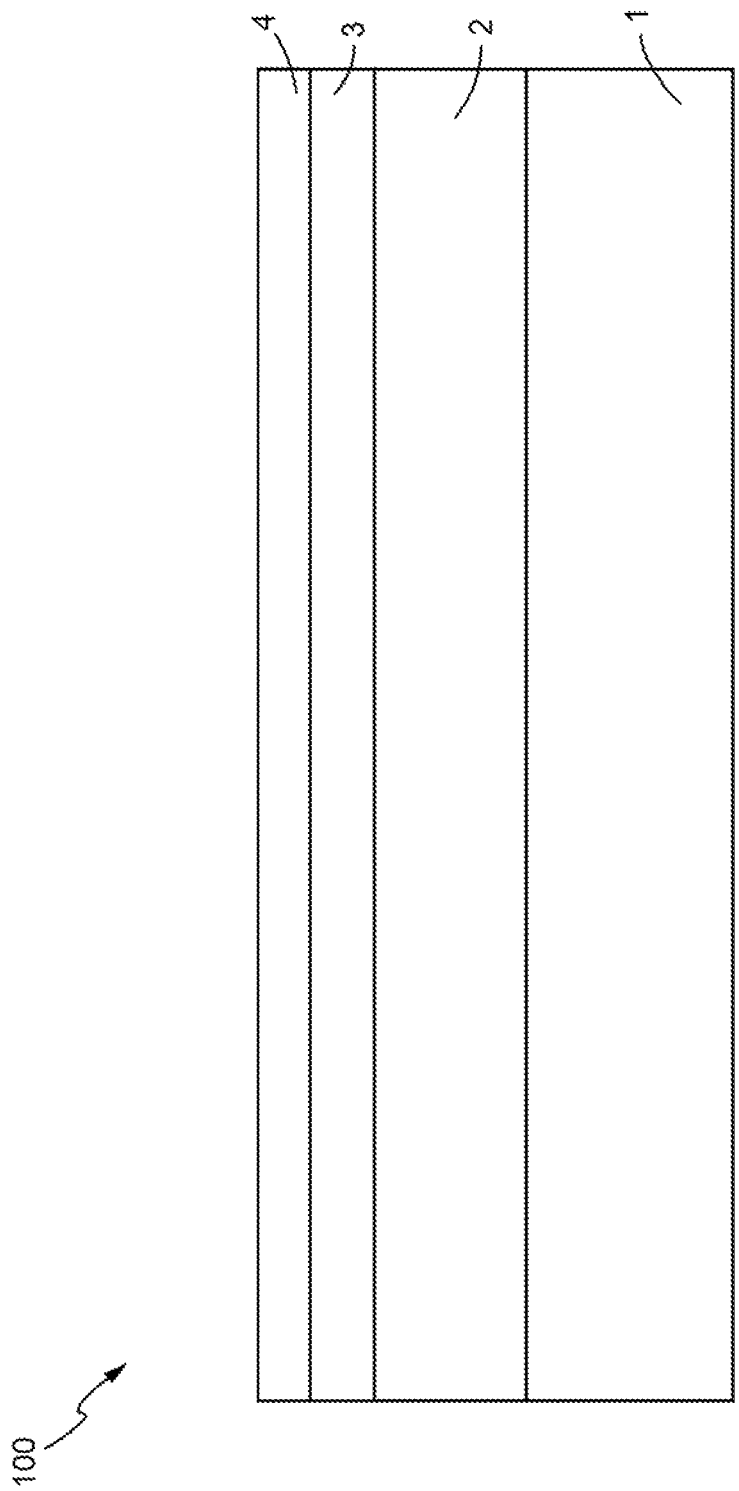
FIGS. 1-5 show a cross-sectional view of a vertical-channel MOSFET during successive manufacturing steps according to an embodiment of the present disclosure.

With reference to FIG. 1, a wafer 100 is pre-arranged having a substrate 1, made of semiconductor material with wide forbidden bandgap, for example 4H-silicon carbide (4H—SiC) of an N+ type, formed on which, for example by means of epitaxial growth, is a semiconductor layer 2, for example of 4H—SiC of an N-type. Then, formed on the semiconductor layer 2 is a first insulation layer 3, made, for example, of TEOS oxide, and deposited on the first insulation layer 3 is a first mask 4, for example made of polysilicon or metal.

Figure 2:
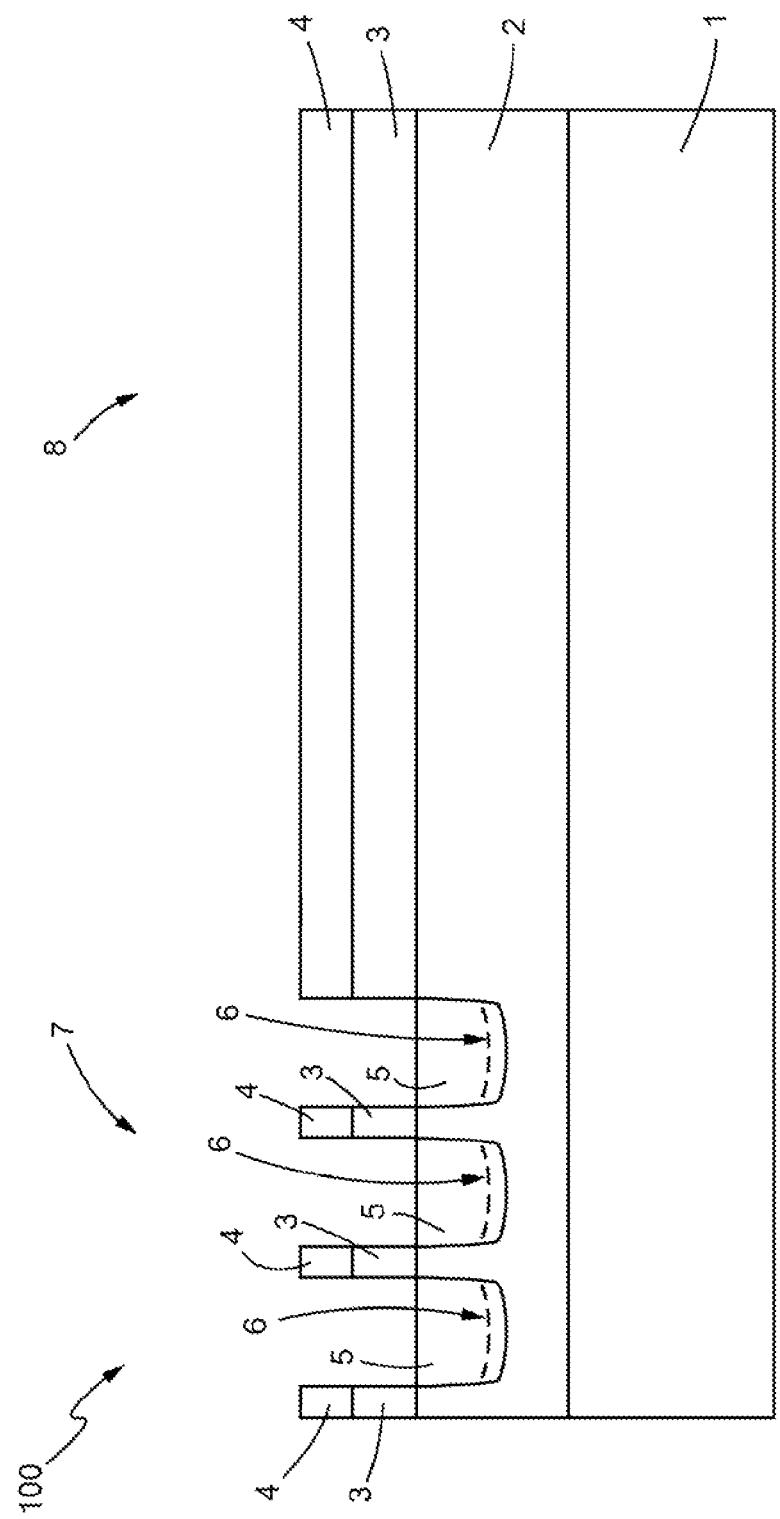

Next (FIG. 2), the first insulation layer 3 and the first mask 4 are selectively removed so as to expose surface portions of the substrate 2, which have, in top plan view, for example a strip shape, and define an active-area region 7. Regions of the wafer 100 external to the active area 7 provide edge regions 8.

Next, a plurality of implantations of dopant elements of a P type are performed, for example, of boron or aluminum, at a temperature of between approximately 300° C. and 1000° C., for example 600° C., with energy of between approximately 30 keV and 1 MeV and doses of between approximately $1 \cdot 10^{12}$ at/cm$^2$ and $5 \cdot 10^{15}$ at/cm$^2$ so as to form body regions 5 within the surface portions of the substrate 1 exposed.

Each body region 5 is formed by means of a plurality of implantations with variable energy and doses, and the sequence of implantation is such as to provide for each body region 5 a tray-like profile, with a surface concentration of the dopant elements approximately equal to the concentration that it is desired to obtain for the conductive channel of the MOSFET device. Since they are power devices designed to work at high voltages (from approximately 500V to 1000V), the channel possesses amounts of charge such that the electric field that is set up during use does not deplete the entire channel, thus triggering the phenomenon known as "channel punch through". For this reason, the channel concentration may be higher than approximately $1 \cdot 10^{17}$ at/cm$^3$. For example, considering a channel of a length of approximately 0.5 μm, the channel concentration may be approximately $3 \cdot 10^{17}$ at/cm$^3$.

In addition, it is expedient for the implantations at higher energy to be also at a higher dose so as to provide a deep-body layer 6, having the function of field-interruption layer, self-aligned with the respective body region 5.

The body regions 5 have, in top plan view, a shape defined by the shape of the surface portions of the substrate 1 previously exposed and extend into the semiconductor layer 2 at a depth of between approximately 0.5 μm and 1 μm, for example 0.8 μm.

The body regions 5 can have other shapes, different from the strip shape, for example, they may be generally polygonal, according to the application.

Figure 3:
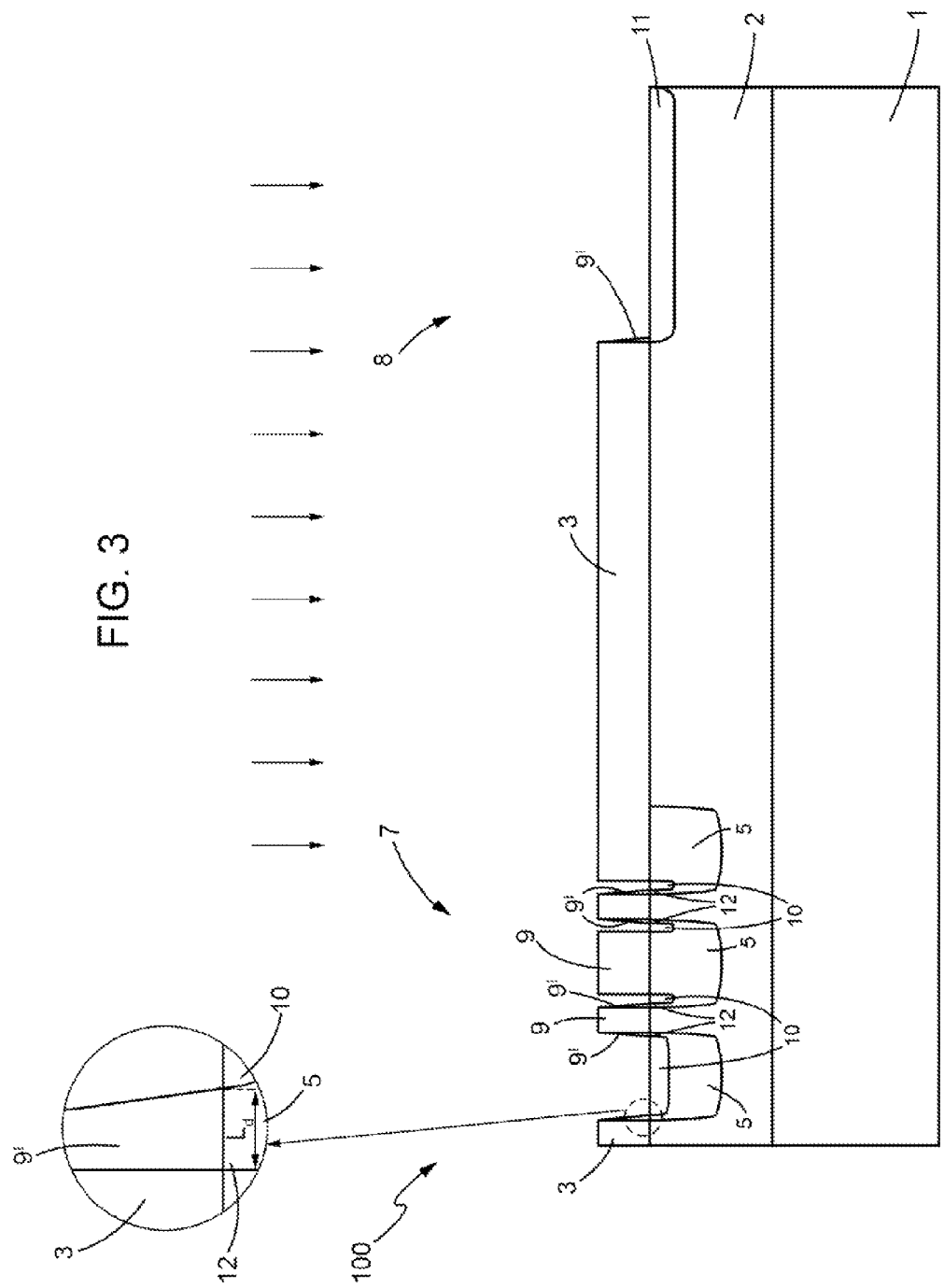

Then (FIG. 3), the first mask 4 is removed, and the insulation layer 3 is defined so as to leave exposed a peripheral region of the wafer 100 (where external edge-ring regions 11 will be formed, as described more fully hereinafter). On the wafer 100 there is then formed and defined, by means of successive steps of deposition, photolithography, and etching, a second mask 9, for example, made of TEOS oxide, so as to mask the wafer 100 during the subsequent implantation step except for portions in which it is desired to form source regions 10 and external edge-ring regions 11. In detail, as illustrated more clearly in the enlargement of FIG. 3, the second mask 9 is defined so as to form spacers 9' between the source regions 10 and the semiconductor layer 2.

The width $L_d$ of each spacer 9' defines the length of a channel region 12 in which, in use, the conduction channel is formed. More precisely, the channel region 12 is comprised between the source region 10 and the semiconductor layer 2 (in turn coupled to a drain region, according to a typical configuration of vertical-structure MOSFET devices, as will be described more fully in what follows). $L_d$ may have a value of between approximately 0.3 μm and 0.7 μm, for example 0.5 μm.

By means of a plurality of successive implantations (represented schematically in the figure by arrows) of dopant elements of an N type, for example, phosphorus or nitrogen, at a temperature of between approximately 300° C. and 1000° C., with energy of between approximately 30 keV and 200 keV and doses of between approximately $1 \cdot 10^{14}$ at/cm$^2$ and $5 \cdot 10^{15}$ at/cm$^2$, the source regions 10 and the external edge-ring regions 11 are obtained, the source regions 10 within the body regions 5. In particular, the external edge-ring regions 11 are separate from the body regions 5 and are arranged on external portions of the wafer 100 so as to surround the active-area region 7.

Boundary body regions 5' (just one of which is shown in the figure) arranged in the proximity of the boundary between the active area 7 and the edge region 8, have a source region 10 set on the side facing the inside of the active area 7 and not on the side facing the edge region 8 in order to prevent, in use, setting-up of a parasitic channel between the active area 7 and the edge region 8.

Figure 4:
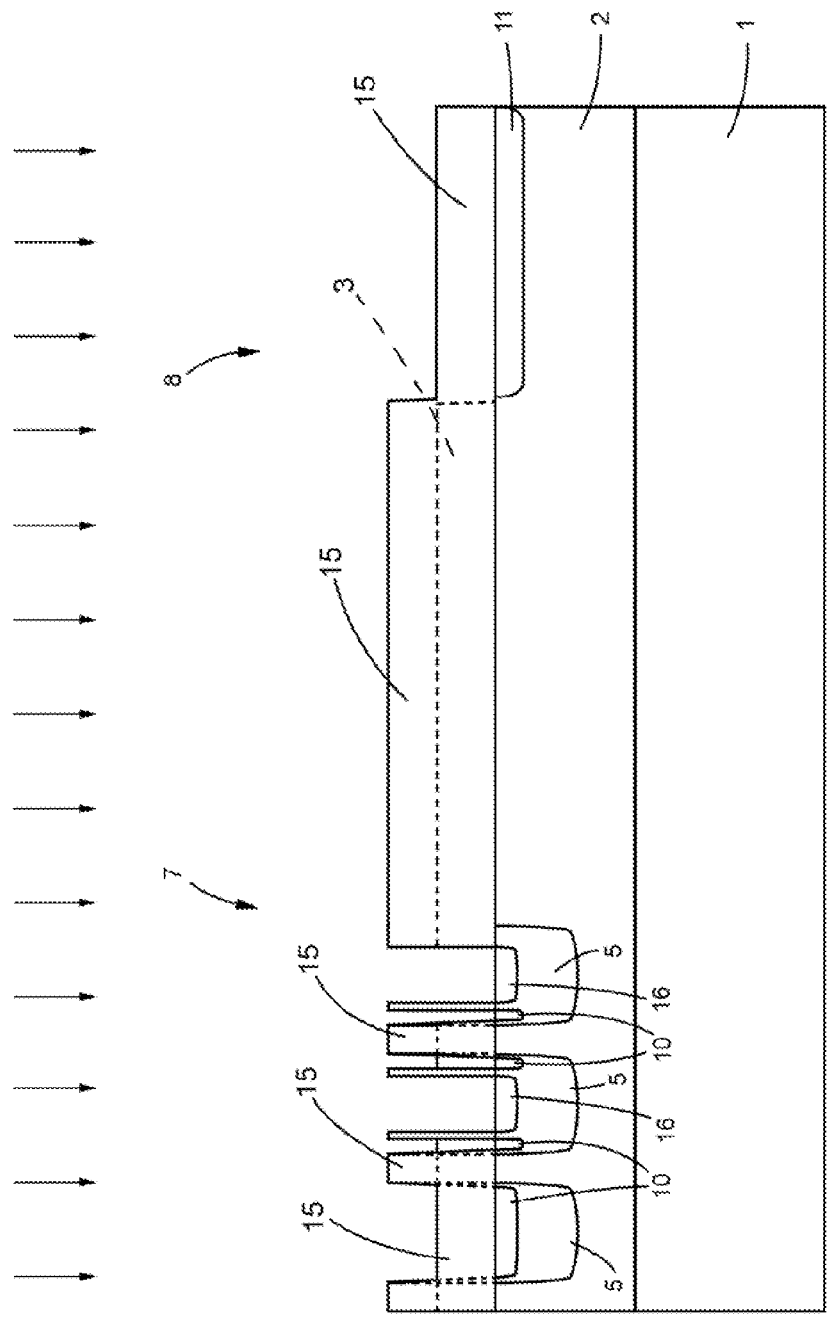

Then (FIG. 4), formed and defined on the wafer 100 is a third mask 15, for example made of TEOS oxide, so as to protect the wafer 100 except for portions of the body regions 5 in which it is desired to form enriched regions 16, of a P+ type, having the function of ohmic contact. A subsequent implantation step (schematically represented in the figure by arrows) of dopant elements of a P type, for example, boron or aluminum, enables formation of the enriched regions 16, of a P+ type, inside the body regions 5, in portions of the latter not protected by the third mask 15.

Next (FIG. 5), all the mask layers present on the wafer 100 (in particular, the second and third masks 9, 15) are completely removed from the wafer 100, for example, by a wet etch of the buffered-oxide-etching (BOE) type.

Figure 5:
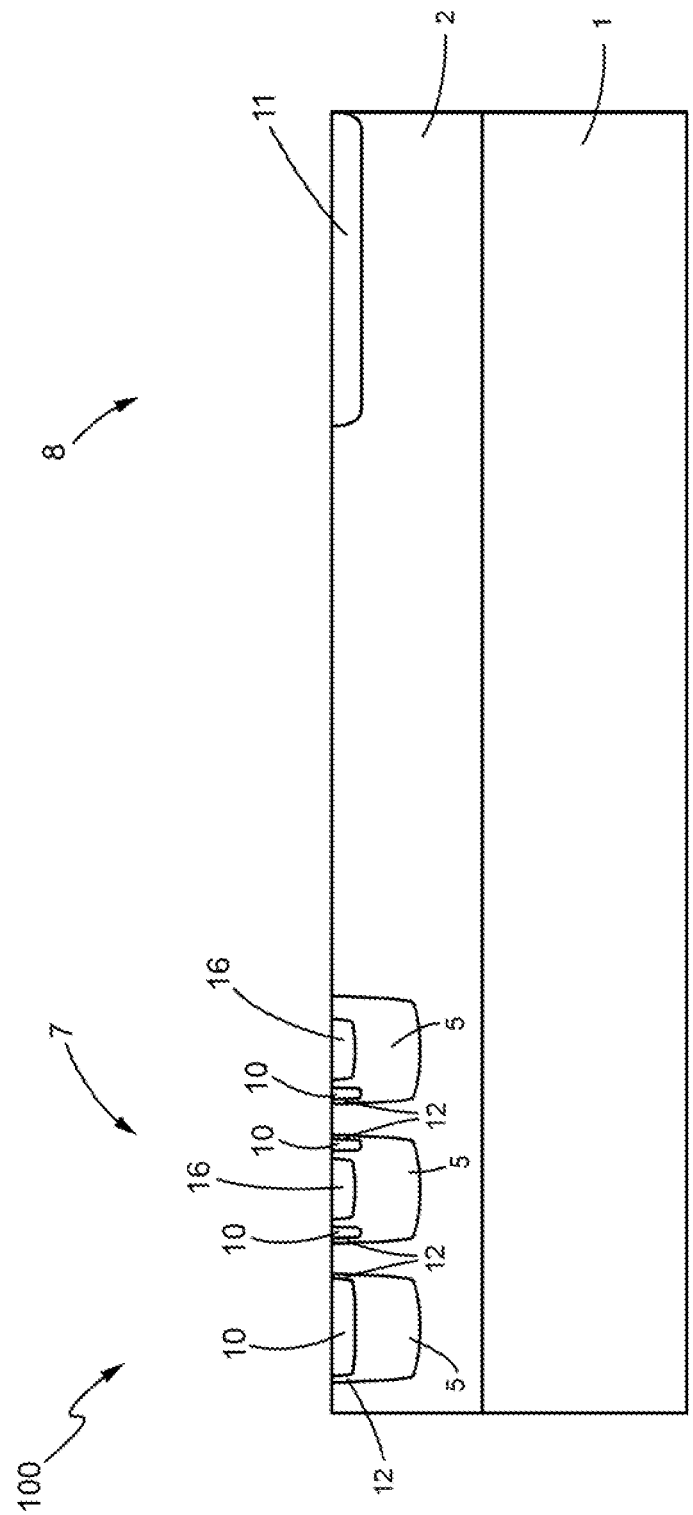
Figure 6:
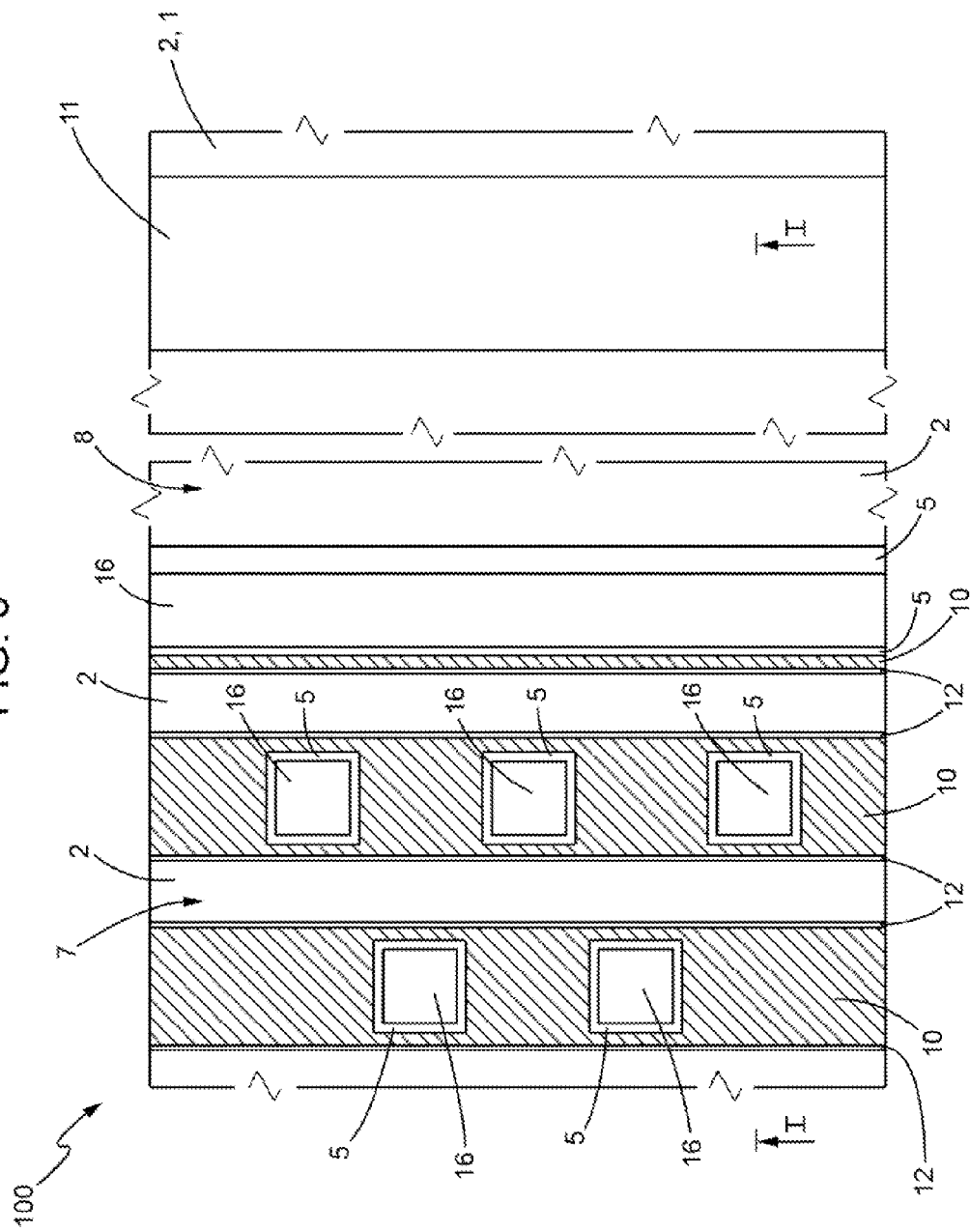
FIG. 6 shows a top plan view of a portion of a wafer following upon the manufacturing steps according to FIGS. 1-5.

FIG. 6 shows a top plan view of a portion of the wafer 100 following upon the manufacturing steps described up to now, of which FIGS. 1-5 are cross-sectional views along a line of cross section I-I of FIG. 6. As may be noted, the body regions 5 have a substantially rectangular shape and each comprise a plurality of enriched regions 16, having a substantially quadrangular shape, and a single source region 10 having a substantially H shape.

With joint reference to FIGS. 5 and 6, in this process step it is possible to activate the dopant elements previously implanted by means of a thermal-annealing process at a high temperature, as may be required by the specific properties of the substrate used and of the implanted dopant elements. For example, an annealing process is carried out at a temperature of between approximately 1500° C. and 1800° C., for example 1700° C. Since the first and second masks have been completely removed, the annealing step at these temperatures does not raise any problems.

In order to maintain a proper alignment of the process masks during the successive manufacturing steps, appropriate markers may be used, provided, for example, by means of a dry-etching process in an area of the wafer 100 external to the one in which it is intended to create the MOSFET. Said markers are used as alignment signs after the step of complete removal of the mask layers present on the wafer 100 before the annealing process for activation of the implanted dopant elements.

Figure 7:
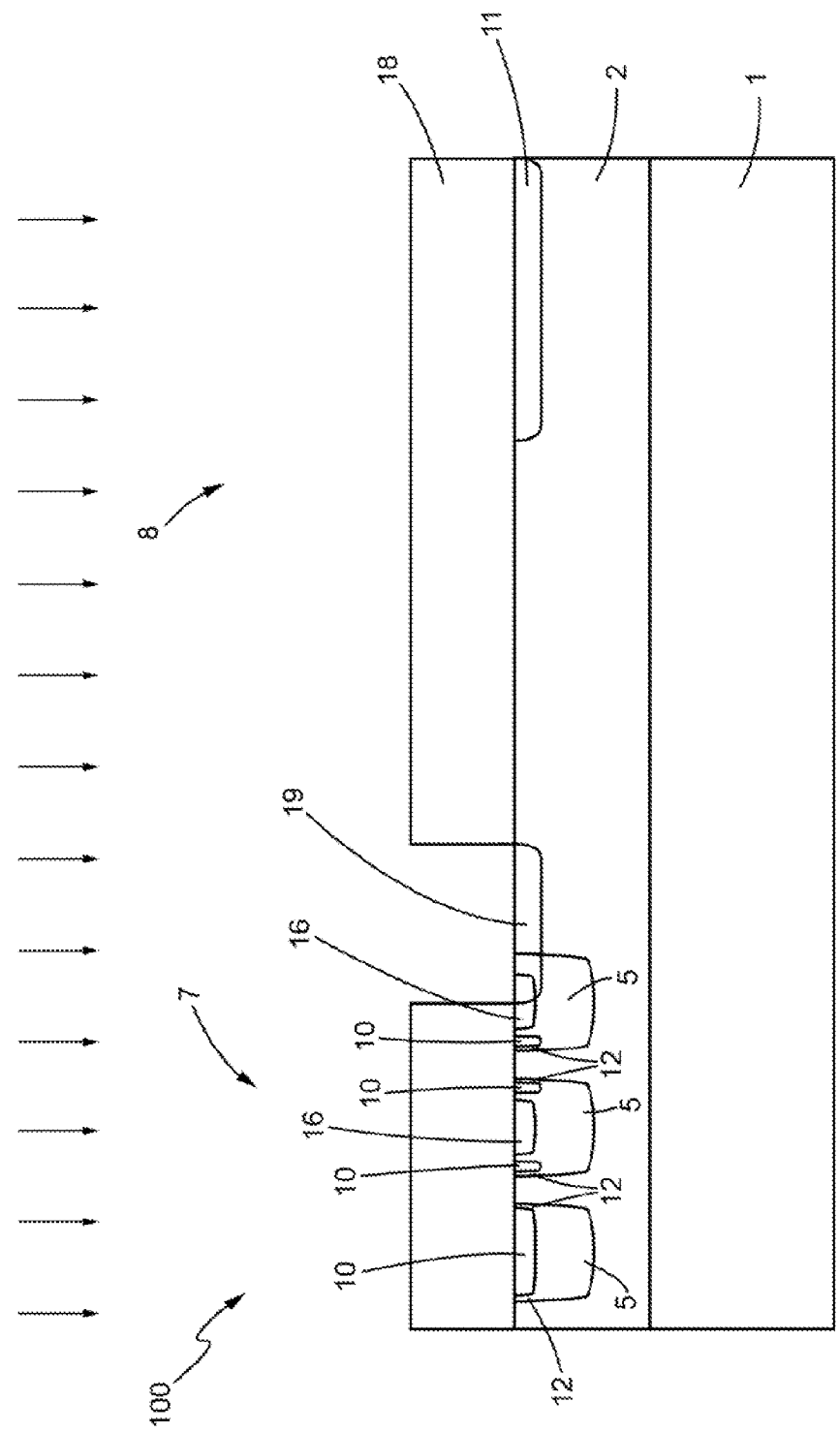
FIGS. 7-10 show a cross-sectional view of a vertical-channel MOSFET during successive manufacturing steps, following upon the manufacturing steps according to FIGS. 1-5, according to an embodiment of the present disclosure.

Then (FIG. 7), on the wafer 100 a fourth mask 18 is formed, for example, made of TEOS oxide with a thickness of approximately 0.5 μm and 1.5 μm, for example 1 μm, and is defined so as to expose surface portions of the semiconductor layer 2 set at the boundary between the active area 7 and the edge region 8. A subsequent implantation step of dopant elements of a P type, for example, boron or aluminum, at approximately room temperature enables formation of a radiusing region 19, having the function of edge-termination element, and being designed to define a radiusing between the active area 7 and the edge region 8. In use, during operation in inhibition of the MOSFET, the radiusing region 19 enables spacing-out of the lines of electric potential, which, if they were dense, might cause an early breakdown of the transistor. The radiusing region 19 has, for example, in top plan view, a substantially quadrangular closed shape with chamfered angles, surrounding the active-area region 7 and partially superimposed on the active-area region 7.

Figure 8:
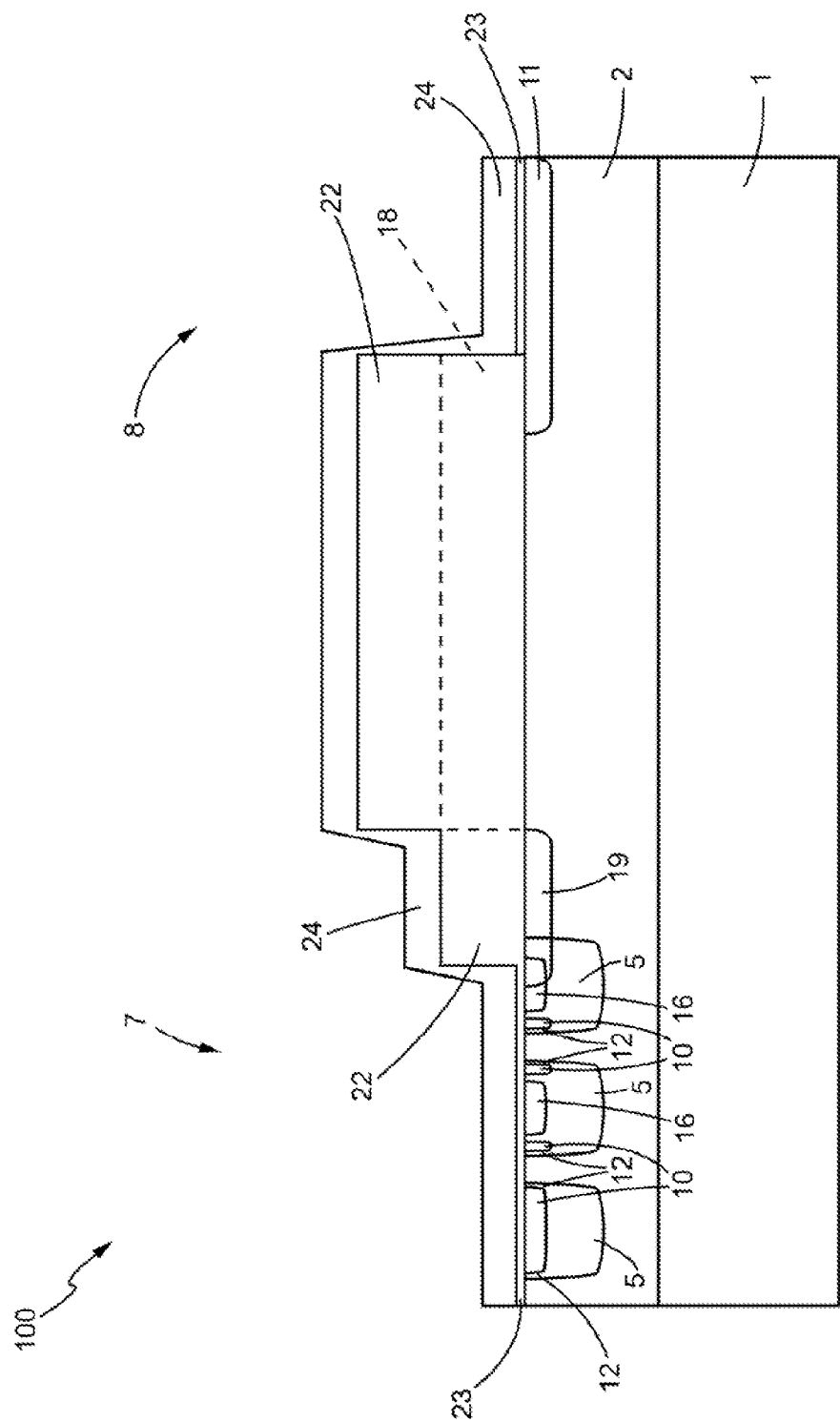

Then (FIG. 8), the fourth mask 18 is partially removed; in particular, it is removed on the active-area region 7 and on part of the external edge-ring regions 11. Then formed on the wafer 100 is a second insulation layer 22, made, for example, of TEOS oxide, having a thickness of between approximately 0.5 µm and 1.5 µm, for example 1 µm.

In this way on a portion of the wafer 100 comprised between the active-area region 7 and the edge region 8, a thick-oxide layer (for example, having a thickness of between approximately 1 µm and 3 µm, for example 2 µm) is obtained, which has the function, during use, of field dielectric.

Then formed on the wafer 100 is a third insulation layer 23, made of dielectric material with a thickness of between approximately 10 nm and 100 nm, for example, made of oxide completely deposited or oxide grown by (wet or dry) oxidation of the semiconductor layer 2, to which there may follow an optional step of thickening by means of a further deposition of oxide. Next, formed on the wafer 100 is a gate layer 24, for example, made of doped polysilicon or metal, having the function, in use, of gate electrode.

According to a technique used for the formation of the third insulation layer 23 and of the gate layer 24, similar layers may be formed also on the back of the wafer 100. In this case, a step of polishing (not shown) of the back of the wafer 100 may be performed for removing said undesired layers.

Figure 9:
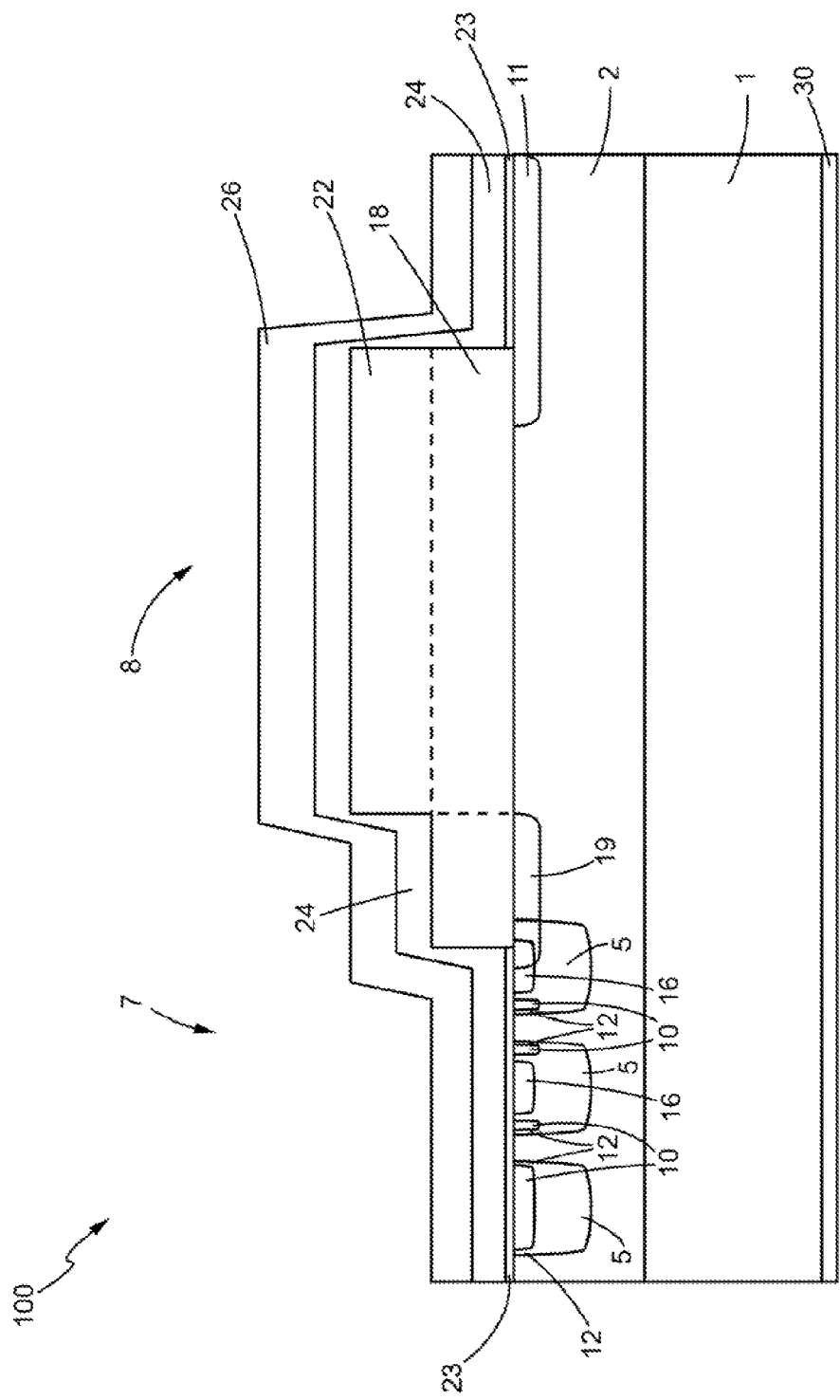

Next (FIG. 9), formed on the wafer 100 is a fifth mask 26, made, for example, of deposited oxide, for protection of the front of the wafer 100, and formed on the back of the wafer 100 is a drain-electrode layer 30, made of conductive material, for example, nickel deposited using a sputtering technique to obtain a layer with a thickness of between approximately 50 nm and 150 nm, for example 100 nm.

Figure 10:
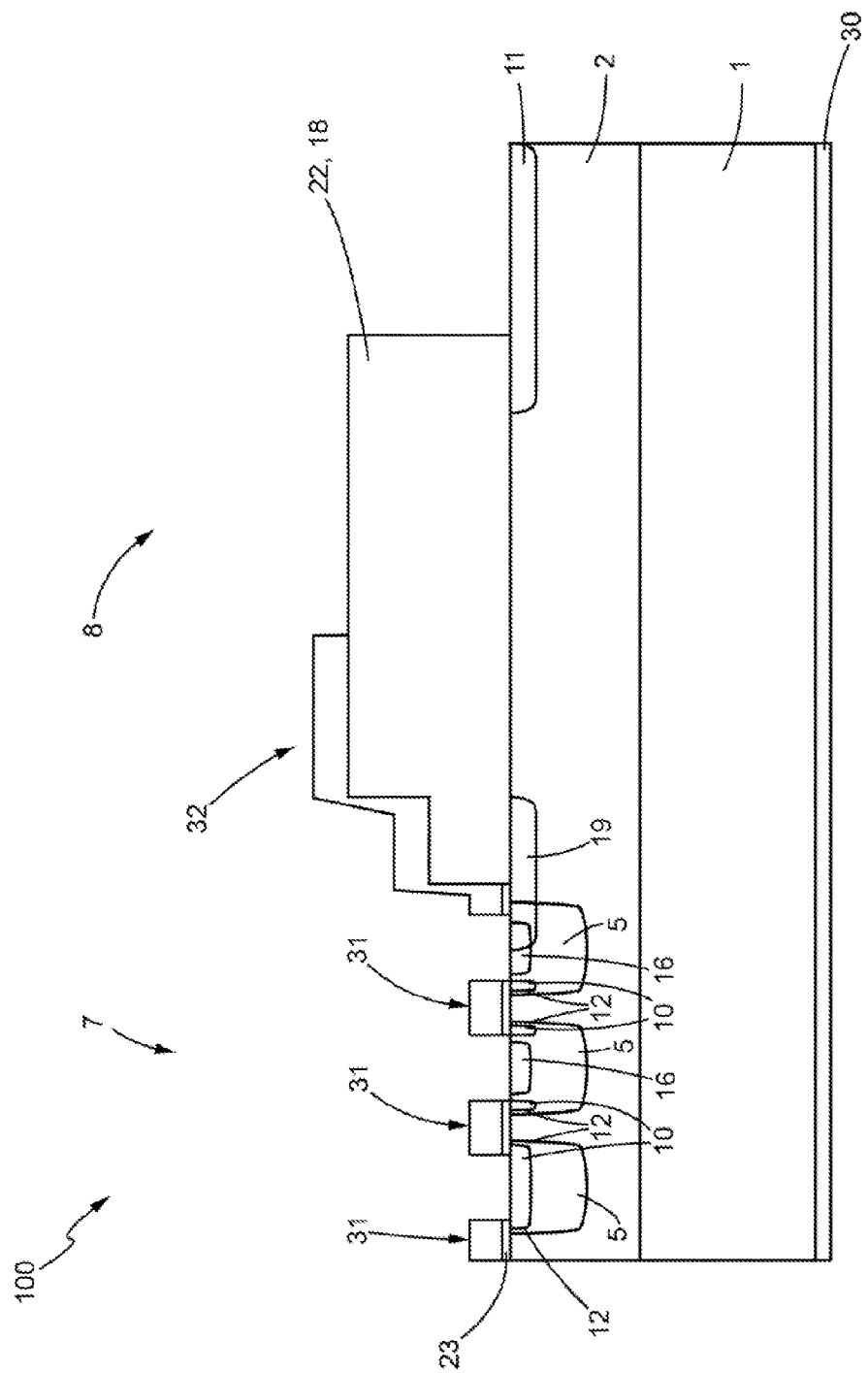

Next (FIG. 10), the fifth mask 26 is removed, and the gate layer 24 and the third insulation layer 23 are etched for removing selectively portions thereof so as to form gate electrodes 31 and first gate-contact regions 32. In particular, the gate electrodes 31 comprise a portion of the third insulation layer 23 in direct contact with respective source regions 10 and a portion of the gate layer 24 set on top of, and vertically aligned to, the portion of third insulation layer 23.

The width of the gate electrodes 31 may be equal to or greater than the sum of the horizontal dimension of the JFET (distance between two adjacent body regions 5) and twice the characteristic misalignment of the photo-exposure equipment used.

It is, moreover, expedient to provide an electrical contact between the gate electrodes 31 and the first gate-contact regions 32, for causing, in use, biasing of all the gate electrodes 31.

The first gate-contact regions 32 may have, in cross-sectional view, a substantially stepwise shape (with triple step as shown in the figure), and are formed on part of the radiusing region 19 and on part of the second insulation layer 22. In this way, during use of the MOSFET device, the first gate-contact regions 32 also perform the function of a shield for the electric-field lines, which are conveyed onto portions of the edge region 8 that have a thick dielectric (defined by the thicknesses of the fourth mask 18 and of the second insulation layer 22), thus potentially preventing breakdown phenomena.

Figure 11:
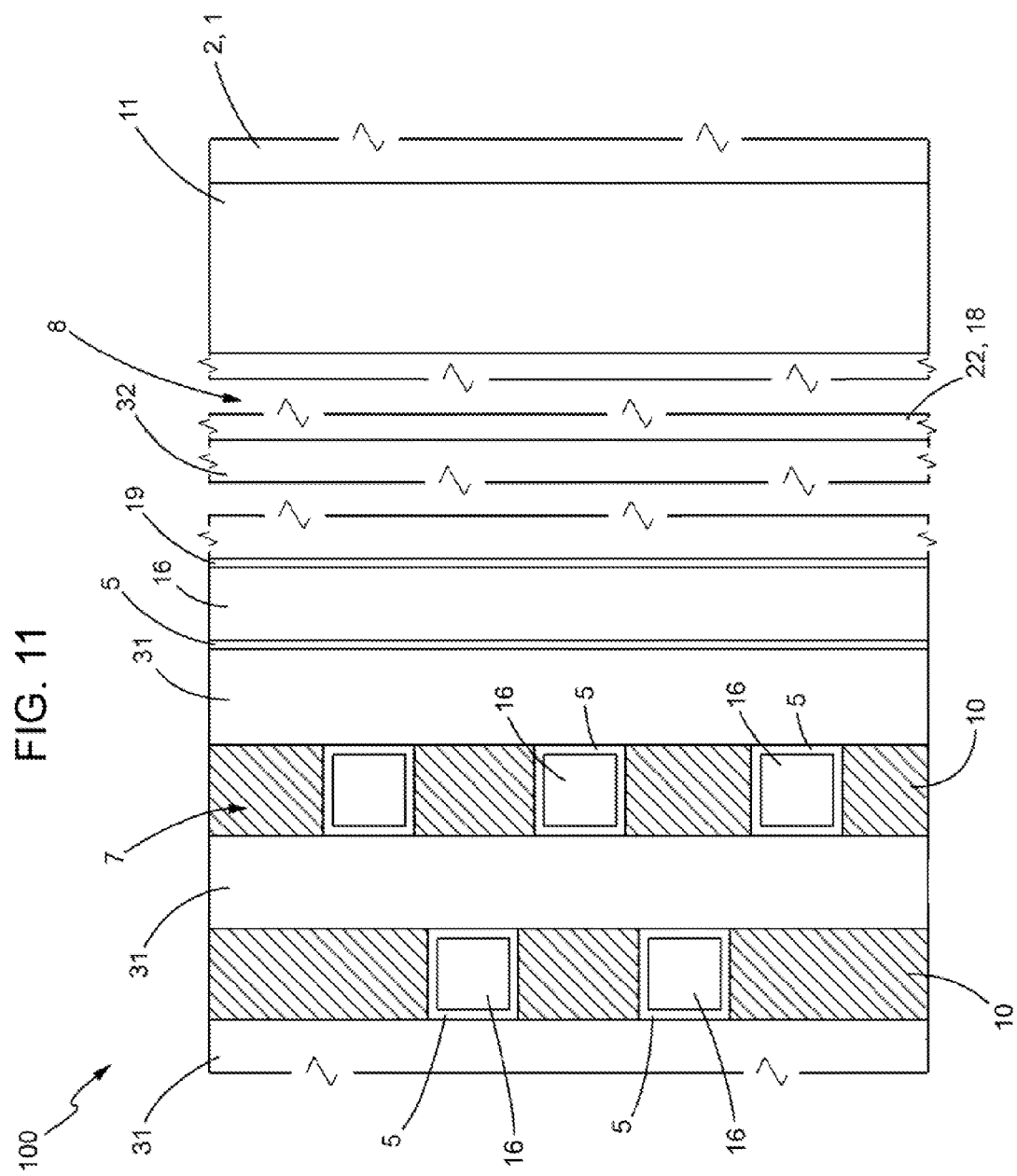
FIG. 11 shows a top plan view of a portion of a wafer following upon the manufacturing steps according to FIGS. 7-10.

FIG. 11 shows a top plan view of the same portion of the wafer 100 of FIG. 6 following the manufacturing steps described up to now. As may be noted, the gate electrodes 31 extend approximately parallel to the body regions 5, between adjacent body regions 5 and partially superimposed on the body regions 5 so as to be partially superimposed on the source regions 10.

Figure 12:
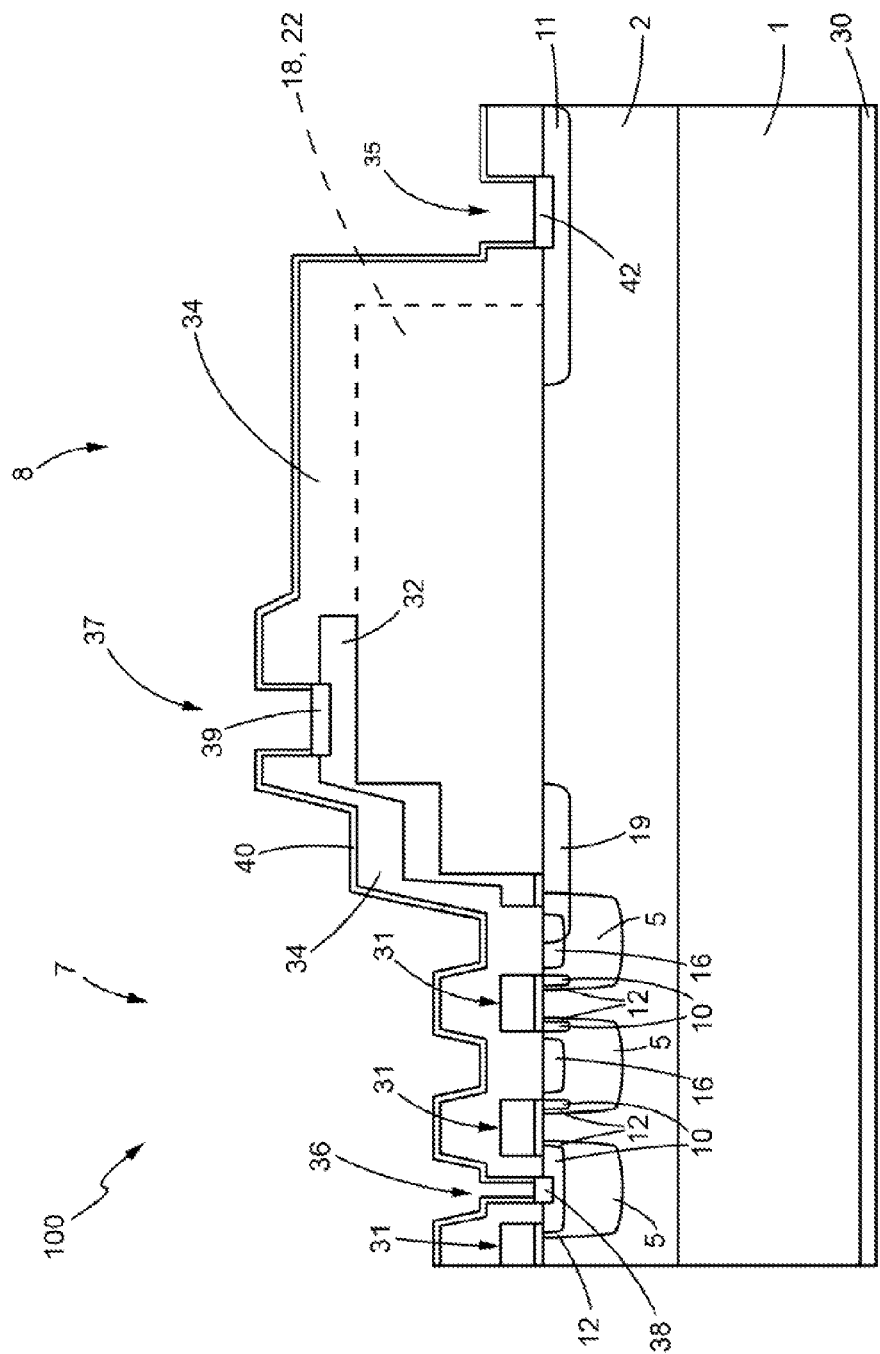
FIGS. 12-14 show a cross-sectional view of a vertical-channel MOSFET during successive manufacturing steps, following upon the manufacturing steps according to FIGS. 7-10, in accordance with an embodiment of the present disclosure.

Next (FIG. 12), formed on the wafer 100 is a fourth insulation layer 34, made of dielectric material, for example, deposited oxide, having a thickness of between approximately 0.5 µm and 1.5 µm, for example 1 µm. The fourth insulation layer 34 is then selectively removed so as to expose: portions of the external edge-ring regions 11 through first openings 35, in which, as will be described more fully in what follows, the contacts of the edge region are formed; portions of the source regions 10 through second openings 36, in which, as will be described more fully in what follows, the contacts of the source regions are formed; and portions of the gate contacts 32 through third openings 37. Then, formed on the wafer 100 is a conductive layer 40, for example, metal deposited by means of a sputtering technique, for example nickel.

A subsequent thermal process, for example a step of rapid thermal annealing (RTA) at a temperature of between approximately 700° C. and 1000° C., for example 900° C. for approximately two minutes, favors formation of silicide in the regions of direct contact between the conductive layer 40 and the semiconductor layer 2, to form source-contact regions 38, second gate-contact regions 39, and edge-contact regions 42.

Figure 13:
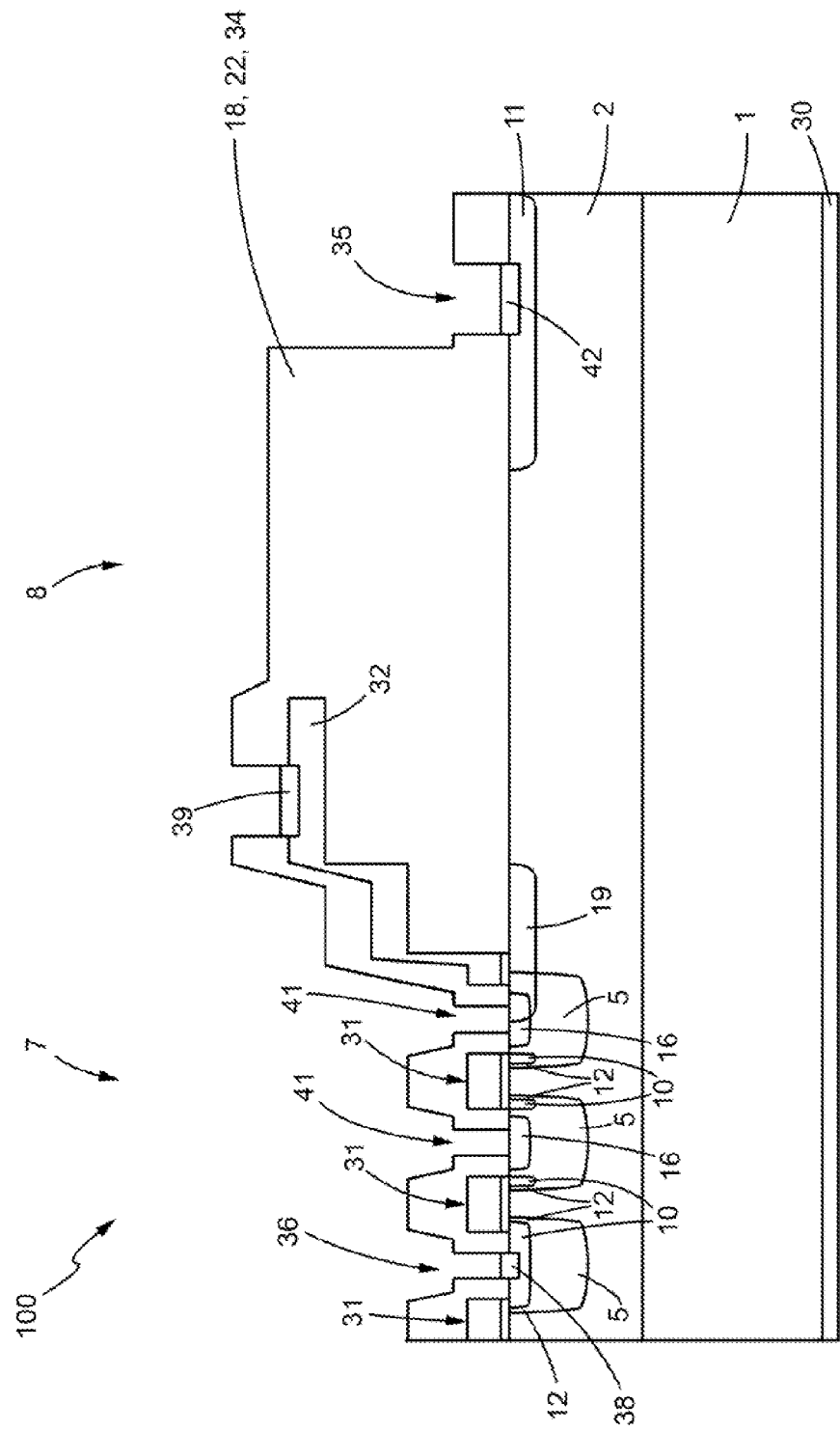

As is shown in FIG. 13, the conductive layer 40 is etched, for example, using a solution of HNO3, so as to remove it from the wafer 100 except for the regions of formation of the silicide. Etching with nitric acid is in fact selective in regard to silicide, which is not removed.

Next, by means of lithographic and etching steps, the fourth insulation layer 34 is selectively removed so as to form fourth openings 41 and expose portions of the enriched regions 16 in which an electrical contact with the source regions 10 is to be created, as described hereinafter.

Figure 14:
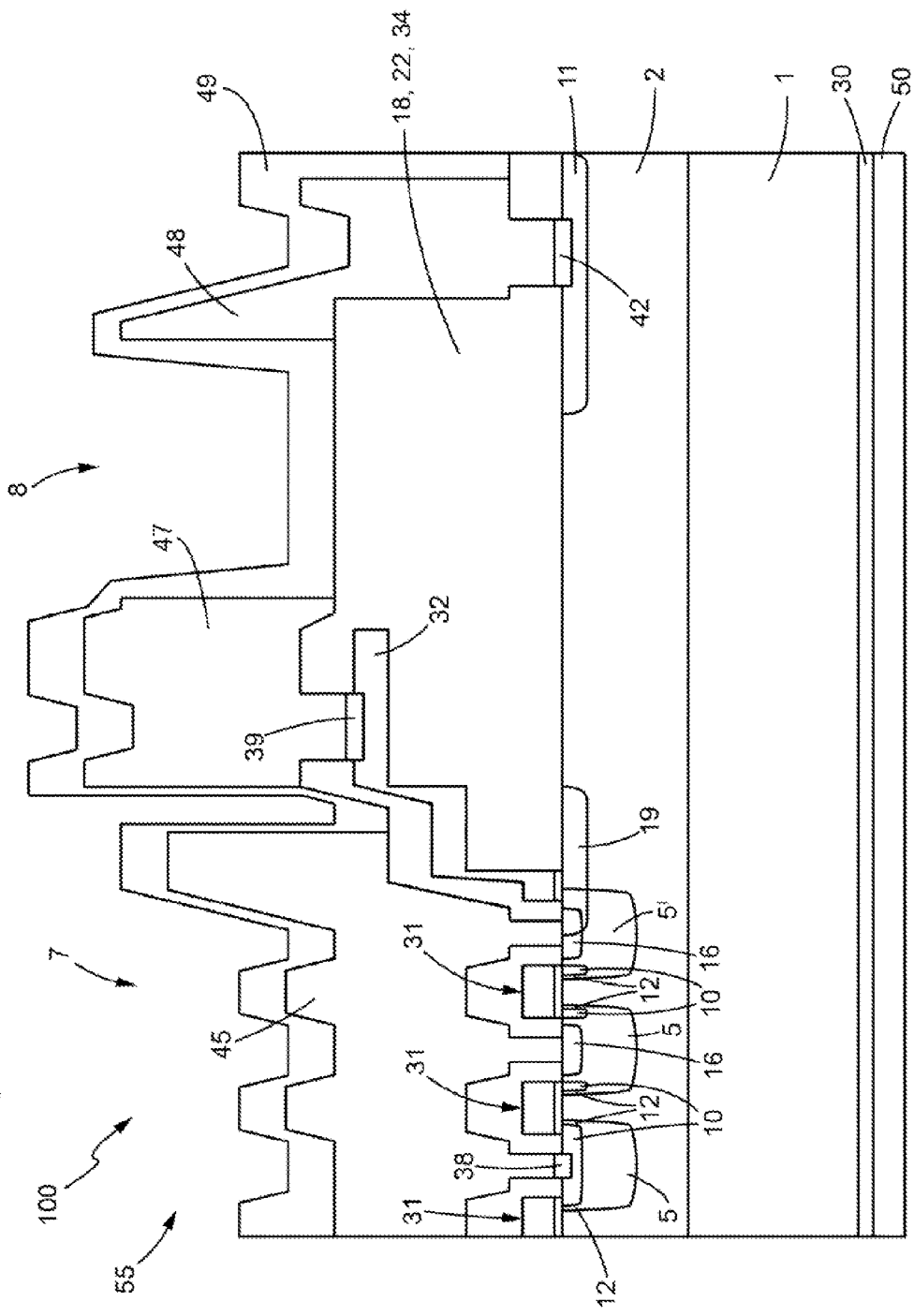

Next (FIG. 14), deposited on the wafer 100 is a layer of conductive material, for example aluminum-silicon (AlSi), so as to fill the first, second, third and fourth openings 35, 36, 37, 41 and form a layer of a thickness of between approximately 1.5 µm and 5 µm on the wafer 100.

Said layer of conductive material deposited is selectively removed to define: a source contact 45 in electrical contact with the source-contact regions 38; a gate contact 47, in electrical contact with the second gate-contact regions 39; and an edge contact 48, in electrical contact with the edge-contact regions 42.

The source contact 45 electrically connects the body regions 5 (through the enriched regions 16) with the source regions 10; using this configuration, it is possible to limit the possibility of a parasitic junction of an NPN type being created between the drain, body, and source regions, which otherwise might cause the destruction of the transistor.

Finally, a passivation layer 49, made, for example, of nitride, is formed on the front of the wafer 100 in order to protect the active area 7 from surface electrical discharges and to isolate it from infiltrations of moisture, and on the back of the wafer 100 a drain contact 50 is formed, made of conductive material, for example a thin film made of titanium, nickel, and gold with a total thickness of between approximately 100 nm and 500 nm.

In this way, a power MOSFET device 55 integrated on a wide-bandgap-semiconductor substrate is provided, equipped with an edge structure formed in a way integrated in the flow of the process for manufacturing the power MOSFET device 55.

In use, it is possible, for example, to bias the source contact 45 and the gate contact 47 at a ground voltage, whilst the drain contact 50 is biased at a high voltage, of between 500 V and 2000 V, for example 1000 V. In addition, since the edge contact 48 is electrically coupled to the drain contact 50 through the external edge-ring regions 11, the edge contact 48 is brought to a voltage that approximates that of the drain contact 50 but for the voltage drop in the substrate 1 and in the semiconductor layer 2.

As is known, one of the characteristics of silicon carbide substrates is that of withstanding a critical electric field higher than the critical electric field withstood by silicon. According to an embodiment of the process described, in particular with reference to FIGS. 1-14, the gate insulators possesses a value of dielectric constant and thickness approximately equal to that of dielectrics used in devices comprising a silicon substrate. A gate dielectric having an excessively large thickness may generate, in fact, a high threshold voltage $V_{th}$, and hence an excessively high driving voltage. Consequently, as is known, in order to reduce the threshold voltage $V_{th}$ it is expedient for the thickness of the gate dielectric to have a reduced thickness. However, in the case of use of a SiC substrate, on the gate dielectric it is possible to concentrate electric fields of a value considerably higher than in devices with silicon substrate. Said electric fields are capable of damaging in an irreversible way the gate dielectrics, jeopardizing the sturdiness and reliability of the devices that use it.

A known solution to this type of problem envisages a mutual approach of the body regions 5, by reducing the lateral distance of body regions 5 set alongside one another. However, this may cause an increase of the JFET resistance, which, in turn, may generate an increase in the resistance of the device in the on state ($R_{ON}$).

In order to solve said problem, it is possible to form a protection region 60, for example, an implanted region of a P+ type, set underneath the gate electrode 31, having a shielding function for the lines of electric field generated during use of the MOSFET device.

Figure 15:
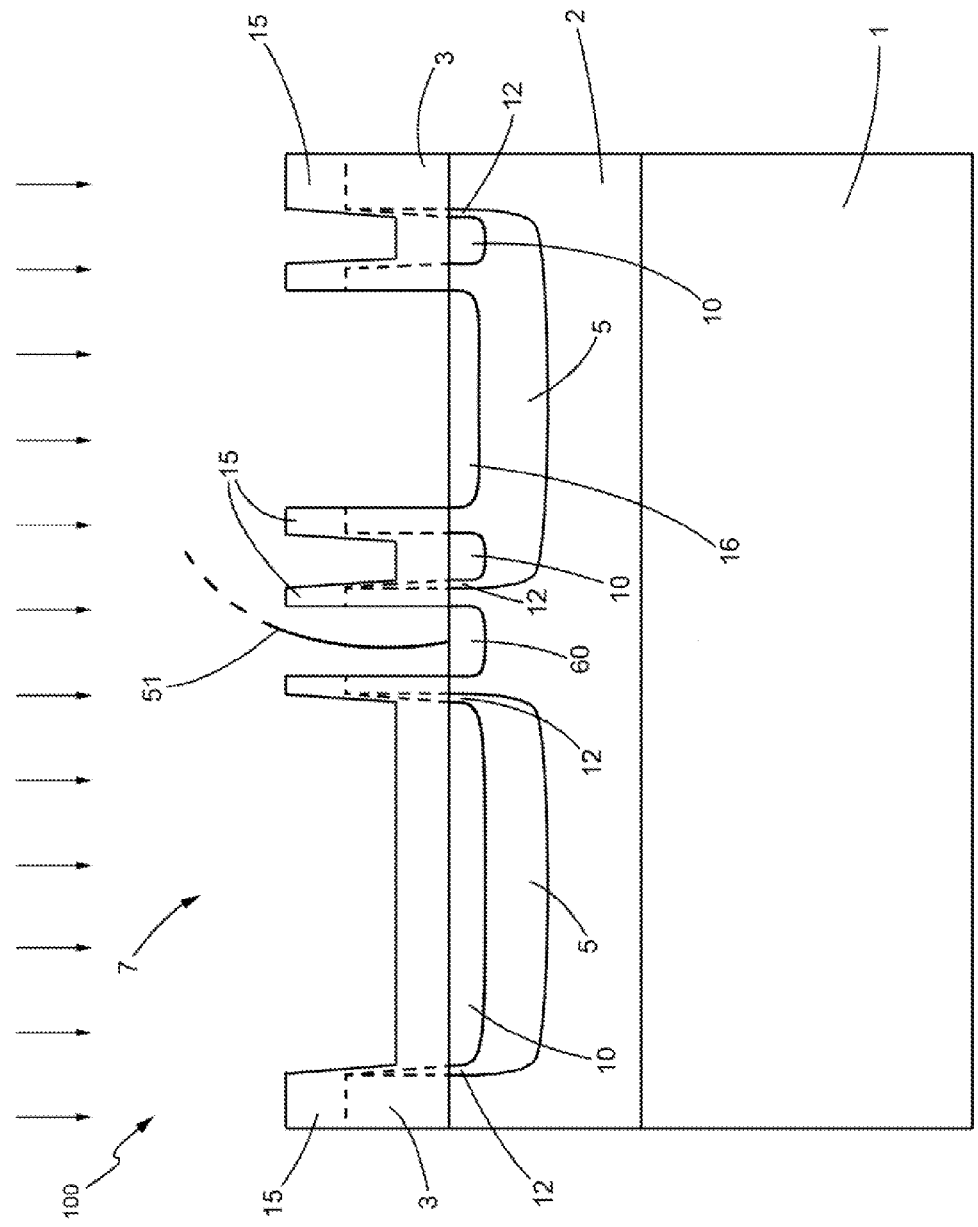
FIG. 15 shows a detail of a portion of active area according to a further embodiment of the present disclosure.

As is shown in FIG. 15, as regards an enlarged detail of the active area 7, said protection region 60 may be formed simultaneously with formation of the enriched regions 16, by appropriately shaping the second and third masks 9, 15 so as to expose portions of the semiconductor layer 2 comprised between adjacent body regions 5.

In this way, during the same step of implantation of the enriched regions 16 it is possible to implant dopant elements of a P type in the portions of the semiconductor layer 2 comprised between non-masked adjacent body regions 5 and form the protection regions 60.

In particular, protection regions 60 set between different body regions 5 may be electrically separated from one another or, alternatively, coupled to one another to form a mesh on the wafer 100.

Each protection region 60 may have a variable width, for example, equal to half the distance d between two body regions 5 set alongside one another, and may be formed at an equal distance from them. In particular, in the presence of a protection region 60, body regions 5 set alongside one another may be set at a distance d apart of between approximately 1 μm and 6 μm.

In this case, however, the protection regions 60 may assume any potential comprised between a source potential (for example, set to ground) and a drain potential, and this may generate, during use of the transistor in switching mode, induced currents that are difficult to control and that may be the cause of malfunctioning of the transistor. In order to solve this problem, it is possible to provide protection regions 60 in electrical contact with the body regions 5, for example, by means of a connection provided above the semiconductor layer 2 (schematically represented in the figure by an electrical-connection cable 51, formed in any area of the protection region 60) or else by forming protection regions 60 extending laterally so as to be in direct electrical contact with the body regions 5. Providing an electrical contact between the protection regions 60 and the body regions 5 (which are in turn in electrical contact with the enriched regions 16) causes the body regions 5, the enriched regions 16, and the protection regions 60 to be once again at the same potential.

From an examination of the characteristics of the process provided according to an embodiment of the present disclosure, advantages that it enables are evident.

For example, the maximum temperature at which to perform annealing for activating the dopant elements is not limited by the presence on the wafer of layers used during previous manufacturing steps, for example, the layers used for the definition of the implanted regions.

In addition, the process enables simultaneous definition of an active area, comprising electronic devices (for example, the power MOSFET device described), and an edge structure, for insulating the active area and bringing the electric fields generated during use onto portions external to the active area that are less subject to breakdown phenomena or damage.

In addition, the presence of the protection region 60, having the function of shield for the dielectric of the gate electrodes, makes it possible to obtain dielectrics of the gate electrodes with a reduced thickness (and hence a device with low threshold voltage $V_{th}$), and obtain, in use, a low value of ON-resistance $R_{ON}$.

Finally, it is clear that modifications and variations may be made to the process and to the device described and illustrated herein, without thereby departing from the sphere of protection of the present disclosure.

Figure 16:
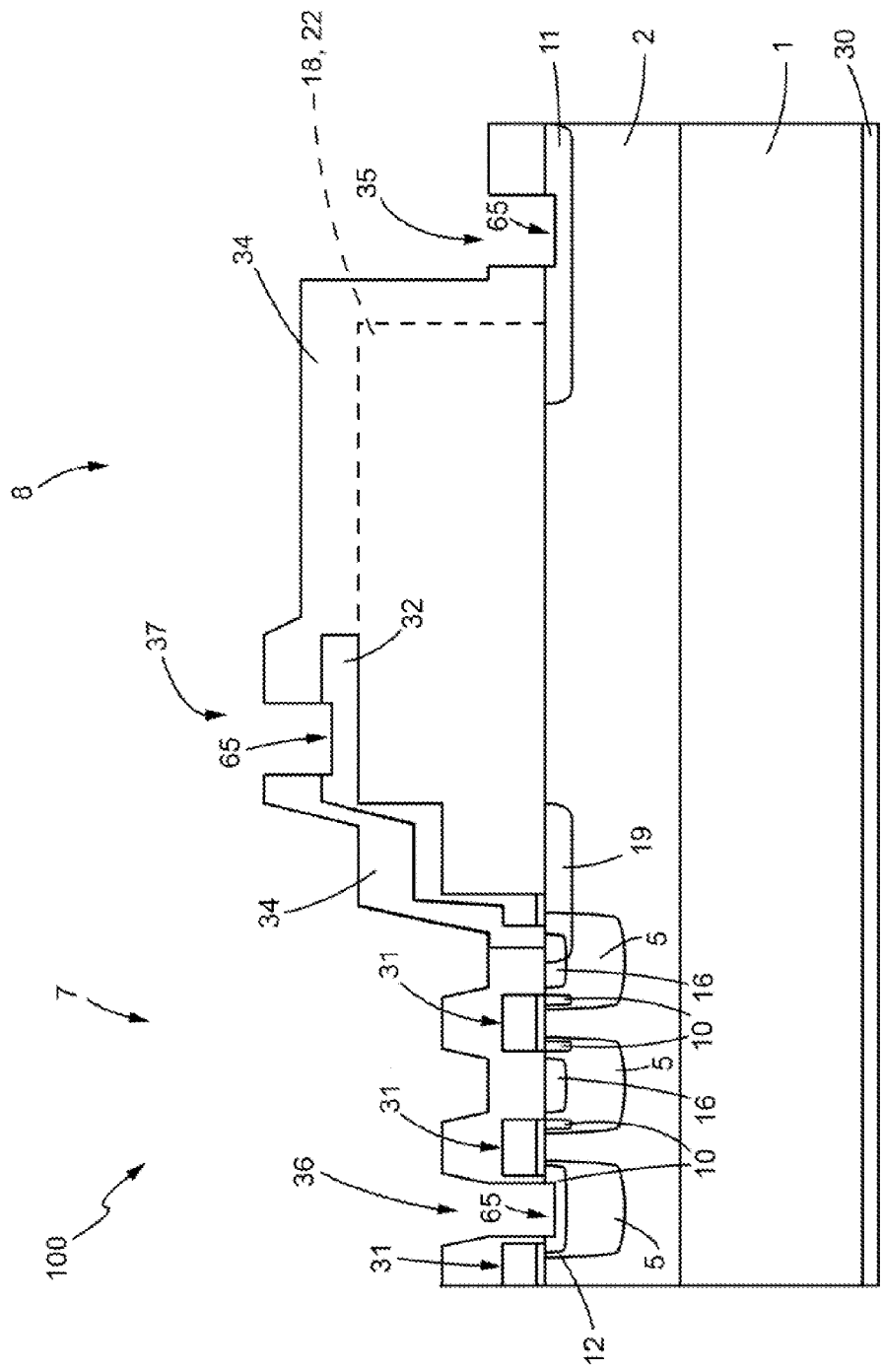
FIG. 16 shows a cross-sectional view of a vertical-channel MOSFET during the manufacturing steps according to a variant of the manufacturing steps shown in FIG. 12.

For example, in an embodiment the source-contact regions 38, the second gate-contact regions 39, and the edge-contact regions 42 may be obtained in an integrated form by means of microtrenches. In detail, as is shown in FIG. 16, as an alternative to the formation of the conductive layer 40 and to the silicide regions (as described with reference to FIG. 12), it is possible to form, for example, by means of successive lithographic and dry-etching steps, the semiconductor layer 2 and the gate-contact regions 32 within the first, second and third openings 35, 36, 37 in which it is desired to form the source-contact regions 38, the second gate-contact regions 39, and the edge-contact regions 42, to obtain microtrenches 65, having preferably a depth of between approximately 0.2 μm and 0.6 μm, for example 0.3 μm, and then, by depositing and defining a conductive layer, form the source-contact regions 38, the second gate-contact regions 39, and the edge-contact regions 42. In this way, the effectiveness and sturdiness of the source-contact regions 38, of the second gate-contact regions 39, and of the edge-contact regions 42 may be improved, with a potential improvement also of the performance in operation of the MOSFET.

In addition, the third openings 37 in which to form the second gate-contact regions 39 may be made simultaneously with the fourth openings 41, and the second gate-contact regions of AlSi may be obtained simultaneously with formation of the gate contact 47.

Finally, it is clear that, with modifications, the process described herein may be used to produce transistors in which the carriers in conduction are of a P type, and moreover to produce electronic devices different from the vertical channel MOSFET described, for example, horizontal channel transistors.

And a device made per any of the embodiments above may form part of a system that includes, for example, an integrated circuit, such as a controller, coupled to the device. The IC and device may be formed on the same or different dies.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An electronic semiconductor power device with wide forbidden bandgap, comprising:
    a semiconductor body having a first conductivity type;
    first and second conductive regions, extending in said semiconductor body and having a second conductivity type;
    third conductive regions, having the first conductivity type, arranged in the first and second conductive regions; and
    at least one gate region arranged on said semiconductor body, at least partially overlapping, and electrically insulated from, the third conductive regions,
    a fourth conductive region extending in the semiconductor body between the first conductive region and the second conductive region and substantially vertically aligned with the gate region, the fourth conductive region electrically coupled to the first and second conductive regions and having the second conductivity.

2. The electronic device according to claim 1, wherein the first and second conductive regions are body regions, and the third conductive regions are source regions of a power MOS transistor.

3. The electronic device, according to claim 1, further comprising channel regions arranged between the third conductive region and the first and second conductive regions.

4. The electronic device, according to claim 1, wherein the semiconductor body is made of silicon carbide.

5. The electronic device according to claim 1, further comprising an edge region, said edge region housing a first ring region surrounding an active area.

6. The electronic device according to claim 5, further comprising a second ring region, having the second conductivity type, set in the proximity of, or partially overlapping, an area of boundary between the active area and the edge region.

7. The electronic device according to claim 6, further comprising an insulation layer arranged above said edge region, partially overlapping said first and second ring regions, and an electric-shield layer arranged within said insulation layer, partially overlapping said second conductive region and said edge region.

8. The electronic device according to claim 7, wherein the electric-shield layer has a substantially stepwise shape and is made of conductive material.

9. The electronic device according to claim 1, wherein the fourth conductive region is in electrical contact with the first and second conductive regions.

10. An electronic device, comprising:
    a first semiconductor layer having a first conductivity;
    first and second body regions disposed in the layer and each having a second conductivity;
    first and second conduction regions respectively disposed in the first and second body regions and each having the first conductivity;
    a protection region disposed in the layer between the first and second body regions and having the second conductivity, the protection region electrically coupled to the first and second body regions; and
    a gate disposed over the first and second conduction regions and the protection region.

11. The electronic device of claim 10 wherein the semiconductor layer comprises silicon carbide.

12. The electronic device of claim 10 wherein:
    the semiconductor layer comprises a drain; and
    the first and second conduction regions comprise source regions.

13. The electronic device of claim 10 wherein:
    the first body region is coupled to the second body region; and
    the first conduction region is coupled to the second conduction region.

14. The electronic device of 10, further comprising a conductor coupled between the body and protection regions.

15. The electronic device of claim 10 wherein at least one of the body regions is coupled to the protection region within the semiconductor layer.

16. The electronic device of claim 10, further comprising an edge region disposed in the layer around the body regions and having the first conductivity.

17. The electronic device of claim 10, further comprising an edge region disposed in the layer around and overlapping at least one of the body regions and having the second conductivity.

18. The electronic device of claim 10 wherein the layer comprises an epitaxial layer.

19. The electronic device of claim 10, further comprising a semiconductor substrate disposed beneath the layer and having the first conductivity.

20. The electronic device of claim 10, further comprising:
    a second semiconductor layer disposed beneath the first layer; and
    a contact disposed over the second layer.

21. A system, comprising:
    an electronic device, comprising:
        a first semiconductor layer having a first conductivity;
        a plurality of body regions disposed in the layer and each having a second conductivity;
        first and second conduction regions respectively disposed in the plurality of body regions and each having the first conductivity;
        a protection region disposed in the layer between a first and second body regions and having the second conductivity;
        a trench disposed over at least one body region that exposes the at least one body region and extending into the first conduction region or the second conduction region of the at least one body region; and
        a gate disposed over the first and second conduction regions and the protection region; and
    a integrated circuit coupled to the device.

22. The system of claim 21 wherein the device and integrated circuit are disposed on a same integrated circuit die.

23. The system of claim 21 wherein the device and integrated circuit are disposed on respective integrated circuit dies.

24. The system of claim 21 wherein the integrated circuit comprises a controller.

25. An electronic device, comprising:
   a first semiconductor layer having a first conductivity;
   a body region disposed in the layer and having a second conductivity;
   a conduction region disposed in the body region and having the first conductivity;
   a gate disposed over the conduction region;
   a trench disposed over the body region and extending into the conduction region; and
   a stepped gate contact electrically coupled to the gate.

26. The electronic device of claim 25 wherein the stepped gate contact includes a metal.

* * * * *